United States Patent
Madine et al.

[11] Patent Number: 5,909,124
[45] Date of Patent: Jun. 1, 1999

[54] APPARATUS AND METHOD FOR TESTING A CIRCUIT BOARD

[75] Inventors: Anthony Madine, Krskine; Alexander Nicol, Greenock, both of United Kingdom

[73] Assignee: International Business Machines Corporation, Armonk, N.Y.

[21] Appl. No.: 08/635,120

[22] Filed: Apr. 19, 1996

[30] Foreign Application Priority Data

Jun. 14, 1995 [GB] United Kingdom ............... 9512101

[51] Int. Cl.⁶ .................... G01R 1/073; G01R 31/02
[52] U.S. Cl. .......................... 324/761; 324/527
[58] Field of Search .................. 324/754, 72.5, 324/755, 758, 158.1, 761, 133, 527, 528; 340/635, 653

[56] References Cited

U.S. PATENT DOCUMENTS

| | | | |
|---|---|---|---|
| 3,068,403 | 12/1962 | Robinson | 324/72.5 |
| 4,152,644 | 5/1979 | Lockhart, Jr. | 324/754 |
| 4,340,860 | 7/1982 | Teeple, Jr. | 324/758 |
| 4,672,313 | 6/1987 | Hartman et al. | 324/72.5 |

*Primary Examiner*—Ernest F. Karlsen
*Attorney, Agent, or Firm*—H. Daniel Schnurmann

[57] ABSTRACT

Apparatus for testing an electrical circuit having: a base for receiving a printed circuit board carrying the electrical circuit, wherein the base section includes a plurality of test pins for contacting a corresponding plurality of solder pads formed on a surface of the circuit board; a cover section comprising a test head facing an opposite surface of the printed circuit for shorting together a plurality of contacts of a component of the electrical circuit connected to the plurality of solder pads and mounted on the opposite surface of the circuit board; means for applying a stimulus signals to at least one test pin; and means for detecting a signal at a second test pin.

15 Claims, 1 Drawing Sheet

APPARATUS AND METHOD FOR TESTING A CIRCUIT BOARD

FIELD OF THE INVENTION

The present invention relates generally to an apparatus and method for testing printed circuit boards, and more particularly, to an apparatus and method for testing connectors mounted on printed circuit boards.

BACKGROUND OF THE INVENTION

In a typical automated high volume manufacturing facility for fabricating electronic products, such as computer visual displays or television receivers, the operation of each electronic circuit in the product is automatically tested by a functional tester. The functional tester typically comprises a test fixture for receiving a printed circuit board carrying components of the electronic circuit to be tested. Generally, a test fixture includes a base and a cover pivotably mounted on the base. The printed circuit board to be tested is placed on the base and the cover is then closed over the base for safety. An array of test pins is provided in the base. The pins are positioned to engage solder pads on the printed circuit board received in the fixture. Test instrumentation is connected to the pins to test the function, or at least to ensure continuity of connection of electronic components soldered to the pads. The instrumentation identifies a failure condition if, for example, the solder joint at the pad is defective, or if the component soldered to the pad has failed.

Some electrical components, such as connectors, have electrical contacts on both sides of the printed circuit board. To facilitate testing such components, it is usual to supply test pins on both the base and the cover of the fixture so that both sides of the component can be probed. The accuracy of insertion of such components into the circuit board is critical to the effectiveness of the test pins on the cover part of the fixture. This is especially true in the case of so-called "header" connectors, i.e., a male part of a multi-pin connector. Headers typically comprise an array of upstanding pins engaging a multiple contact socket. Ideally, the header is soldered to the circuit board, in a pin-in-hole arrangement (rather than, for instance, surface mount), keeping the pins perpendicular to the board. However, it is not unusual for the header to be soldered in place to the pins at a slight angle from the perpendicular direction. Although this does not affect the general function of the header, it does affect the functional testing, because the test pins positioned to probe the header pins from above miss their targets. The test instrumentation may thus erroneously indicate a failing condition. Furthermore, the test pins mounted in the cover of the fixture may be bent or otherwise damaged during use, leading to reduced reliability. The populated printed circuit board is placed on a "bed of nails" tester for functional testing. In the bed of nail tester, test pins are selectively brought up from the test bed to engage with pads on the printed circuit board.

SUMMARY OF THE INVENTION

In accordance with the present invention there is now provided an apparatus for testing an electrical circuit, the apparatus including a base for receiving a printed circuit board carrying the electrical circuit, the base comprising a plurality of test pins for contacting a corresponding plurality of solder pads formed on a first surface of the circuit board; a cover that includes a test head facing a second surface of the printed circuit for shorting together a plurality of contacts of a component of the electrical circuit connected to the plurality of solder pads and mounted on the second surface of the circuit board; means for applying a stimulus signal to a first one of the test pins; and means for detecting the stimulus signal from a second one of the test pins.

In accordance with another aspect of the invention, a shorting pad is brought down from above onto the upstanding pins of the header while test signals are applied to and monitored from the header below via the bed of nails test pins. The test head preferably includes a resilient pad, a contact strip mounted on the resilient pad, and an actuator connected to the resilient pad for selectively urging the contact strip against the contacts of the component.

In a preferred embodiment of the present invention, the actuator also includes a pneumatic plunger.

Viewing the present invention from another aspect, there is now provided a method for testing a electrical circuit that includes the steps of: receiving a printed circuit board carrying the electrical circuit in a base; contacting a plurality of test pins in the base with a corresponding plurality of solder pads formed on a first surface of the circuit board; shorting a plurality of contacts of a component of the electrical circuit connected to the plurality of solder pads and mounted on the second surface of the circuit board with a test head on a cover part facing a second surface of the printed circuit; applying a stimulus signal to a first one of the test pins; and detecting the stimulus signal from a second one of the test pins.

BRIEF DESCRIPTION OF THE DRAWINGS

A preferred embodiment of the present invention will now be described by way of example only with reference to the accompanying drawings, in which.

DETAILED DESCRIPTION OF THE INVENTION

Figure 1:
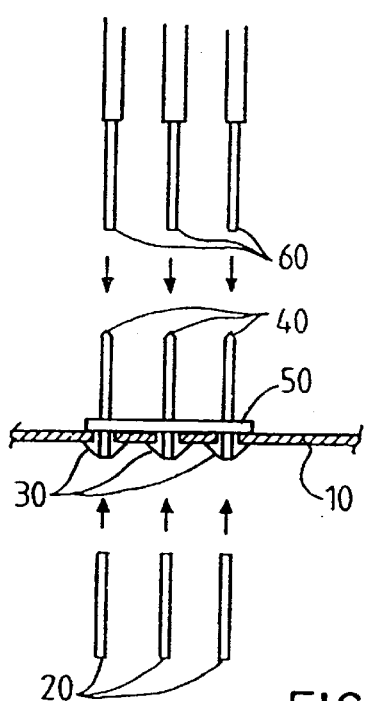
FIG. 1 is a cross-section of a prior art printed circuit board under test.

Referring first to FIG. 1, there is shown a typical functional tester for testing a printed circuit board carrying a header 50 provided with a test fixture for receiving the printed circuit board 10. Headers are well known in the art. A header is a device of the type defined in McGraw Hill Dictionary of Scientific and Technical Terms, 5th. Edition, i.e., "a mounting plate through which the insulated terminals or leads are brought out from a hermetically sealed relay, transformer, transistor, tube or other devices", or in this instance, from the circuit board. Accordingly, all the header pins which are, as previously defined, insulated from one another, are anchored to the circuit board and protrude, as illustrated, through the bottom surface of circuit board 10. These protrusions are referred to hereinafter as contacts 30. The test fixture typically includes a tester base (not shown) and a cover pivotably mounted on the base. The printed circuit board 10 is placed on the tester base and the cover is then closed over the base. An array of test pins 20 is provided in the base. Pins 20 are arranged to engage solder pads 30 on the printed circuit board 10 onto which header 50 is mounted. Another set of test pins 60 is mounted in the cover of the fixture. When the cover is closed over the circuit board 10, pins 60 engage upstanding pins 40 of the header 50. Test instrumentation is connected to pins 20 and 60 to test the function, or at least to test the continuity of connection of the header 50. The instrumentation identifies a failure condition if, for example, the solder joint at any one of the pads 30 is defective. A problem with this arrangement is that the area of possible contact between pins 40 of header 50 and pins 60 is very small. Therefore, any variation in placement of the circuit board 10 in the fixture, whether it is caused by bending of the test pins 60, or by a bad insertion of header 50 can lead to test pins 60 failing to contact pins 40. The tester may thus erroneously indicate a failing condition.

Figure 2:
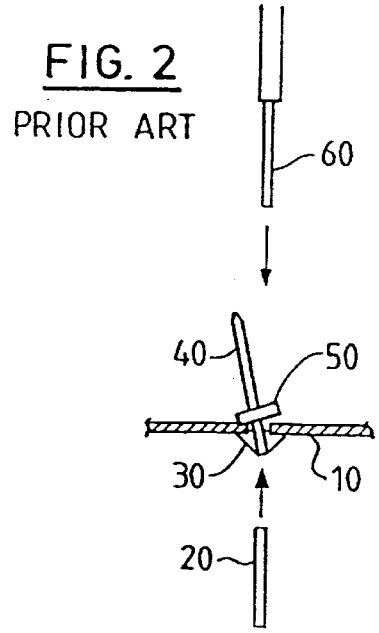
FIG. 2 is another cross-section of the prior art printed circuit board under test.

FIG. 2A shows a typical misalignment condition in which header 50 has been soldered at an angle into board 10 so that pins 40 are skewed with respect to the vertical direction. It will be readily appreciated from FIG. 2A that, although the header may work perfectly well, a lack of contact between pins 40 and pins 60 may result in an erroneous failure detection.

Figure 3:
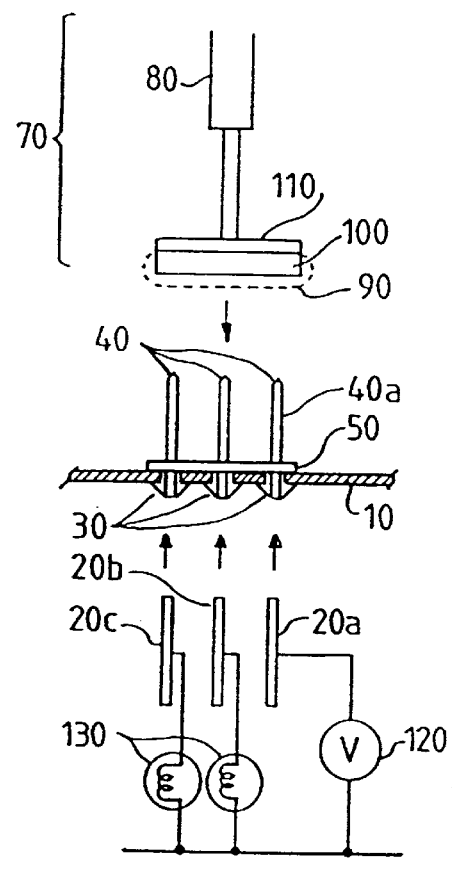
FIG. 3 is a cross section of a printed circuit board under test in accordance with the present invention.
Figure 4:
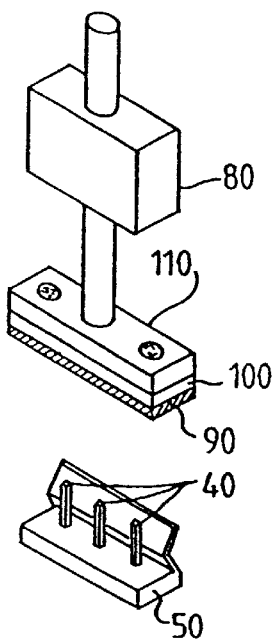
FIG. 4 is a perspective view of a test probe of the present invention.

Referring now to FIG. 3, in a preferred embodiment of the present invention, test pins 60 are replaced in the tester by a single test head 70. FIG. 4 shows the test head from a perspective view. Test head 70 includes a pneumatic plunger 80 connected to rectangular test probe 110. The test probe 110 is made of a resilient pad 100 carrying a downward-facing rectangular electrically conductive flexible contact 90. In particularly preferred embodiments, contact 90 is formed from braid. The plunger 70 is attached to the cover of the fixture.

The aforementioned arrangement operates as follows: a plunger is actuated by a compressed air supply to ensure contact with pins 40 of header 50. The contact 90 is of sufficient length to contact all pins 40 of header 50 simultaneously. The contact 90 is also of sufficient width to simultaneously contact all pins 40 of the header 50 even when the header 50 is imperfectly inserted into the circuit board 10, so that the pins 40 are skewed relative to the vertical direction. The force with which the plunger 80 urges the contact 90 against the pins 40 is sufficient to achieve simultaneous contact in spite of variations in height between the pins. Any differences are compensated by the compliance of the resilient pad 90. It will be appreciated that, when engaged with the header 50, the test head 70 shorts the pins 40 to via contact 90. At the same time, as test head 70 shorts pins 40 together, test pins 20 are brought in contact with solder pads 30 on the underside of the board 10. A stimulus voltage signal V generated by a voltage generator 120 in the test instrumentation is applied to pin 40a of header 50 via test pin 20a. The stimulus voltage signal V is applied to the remaining pins 40 by contact 90. If header 50 functions properly, test pins 20b and 20c detect the stimulus voltage signal on the remaining via the corresponding solder pads 30. The correct operation of the assembly is indicated by appropriate indicators 130 of the test instrumentation. If any of the pins 40 fails to operate properly, the corresponding test pin 20 will not detect the stimulus voltage signal V, and the corresponding indicator will not be activated. If neither of the indicators are actived, a problem may exist with pin 40a of header 50. Practitoners of the art will readily appreciate that, in other embodiments of the present invention, indicators 140 may be replaced with input connections to a microcomputer controlling a functional test procedure for testing the circuit board and for automatically generating a list a failing components faults.

While there has been described what are considered preferred embodiments of the present invention, variations and modifications therein will occur to those skilled in the art once they become acquainted with the basic concepts of the invention. Therefore, it is intended that the appended claims shall be construed to include both the preferred embodiments and all such variations and modifications as fall within the true spirit and scope of the invention.

What is claimed is:

1. Apparatus for testing a header provided with a plurality of pins and mounted on a printed circuit board, the printed circuit board having a plurality of conductive lines terminating in solder pads, the printed circuit board carrying one or more electrical components, the header pins being attached to the solder pads to secure the header to the printed circuit board, the apparatus comprising:

a plurality of test pins, each test pin individually contacting a first end of the header pins;

a test head shorting a second end of the header pins;

means for applying a signal to the first end of a first one of the test pins; and means for detecting, at the first end of the other remaining test pins, the presence of the signal applied to the first test pin.

2. The apparatus as claimed in claim 1, wherein the test head further comprises a resilient pad, a contact strip mounted on the resilient pad, and an actuator connected to the resilient pad for urging the contact strip against the contacts of the component.

3. The apparatus as claimed in claim 2, wherein the actuator further comprises a pneumatic plunger.

4. The apparatus as claimed in claim 1, wherein the means for detecting is an electrical indicator.

5. The apparatus as claimed in claim 1, wherein failure of one of the contacts to make an electrical connection to a corresponding one of the test pins translates into a failure to activate an electrical indicator coupled to a second one of the test pins.

6. The apparatus as claimed in claim 1, wherein the means for applying signals is a voltage generator.

7. The apparatus as claimed in claim 1, further comprising a test head that shorts the contacts of the component of the electrical circuit.

8. The apparatus as claimed in claim 3, wherein the pneumatic plunger is attached to a cover.

9. Apparatus for testing a header provided with a plurality of pins and mounted on a printed circuit board, the printed circuit board having on a first surface a plurality of conductive lines terminating in solder pads, the printed circuit board carrying one or more electrical circuits, the header pins perforating the printed board and being attached to the solder pads on the first surface of the printed circuit board securely fastening the header to the printed circuit board, the apparatus comprising:

facing the first surface of the printed circuit board, a plurality of test pins for contacting a corresponding plurality of the header pins;

a test head facing the second surface of the printed circuit board for shorting a plurality of the header pins;

means for applying a signal to a first one of the test pins; and means for detecting, from a second one of the test pins, the presence of the signal applied to the first test pin.

10. The apparatus as claimed in claim 9, wherein failure to detect the presence of the signal applied to the first test pin is indicative of a defective one of the header pins or misplacement of the header on the printed circuit board.

11. The apparatus as claimed in claim 9, wherein failure of one of the shorted header pins to make electrical contact to the test head translates into a failure to activate the corresponding one of the detection means coupled to the second one of the test pins.

12. The apparatus as claimed in claim 9, wherein the test head includes a pneumatic plunger.

13. The apparatus as claimed in claim 12, further comprises a resilient pad provided with a conductive flexible contact.

14. The apparatus as claimed in claim 9, wherein the detection means is an electrical indicator.

15. The apparatus as claimed in claim 9, wherein the test head further comprises a conductive contact strip mounted on a resilient pad, and an actuator connected to the resilient pad for urging the contact strip against the header pins.

* * * * *